United States Patent [19]

Elbert

[11] Patent Number: 5,267,218
[45] Date of Patent: Nov. 30, 1993

[54] NONVOLATILE MEMORY CARD WITH A SINGLE POWER SUPPLY INPUT

[75] Inventor: Dale K. Elbert, Kelsey, Calif.

[73] Assignee: Intel Corporation, Santa Clara, Calif.

[21] Appl. No.: 861,378

[22] Filed: Mar. 31, 1992

[51] Int. Cl.⁵ .............................................. G11C 13/00
[52] U.S. Cl. ...................................... 365/226; 365/52;
365/189.01; 365/900
[58] Field of Search ............ 365/52, 174, 182, 189.01, 365/230.01, 226, 227, 229, 900

[56] References Cited

U.S. PATENT DOCUMENTS 5,197,033 3/1993 Watanabe et al. ................. 365/226

OTHER PUBLICATIONS

M. A. Levy and D. Elbert, *Solutions for High Density Applications Using Intel Flash Memory* (Oct. 1990), *1991 Memory Products Handbook*, Intel Corporation, pp. 6-297 through 6-344 (1990).

D. Verner, *Designing an Updatable BIOS Using Flash Memory*, *1991 Memory Handbook*, Intel Corporation, pp. 6-248 through 6-296 (Oct. 1990).

Data Sheets for the iMC004FLKA, *1991 Memory Products Handbook*, Intel Corporation, pp. 6-173 through 6-202 (Oct. 1990).

S. Zales and D. Elbert, *Using Flash Memory for In-System Reprogrammable Nonvolatile Storage*, (Oct. 1990), *1991 Memory Products Handbook*, Intel Corporation, pp. 6-203 through 6-247 (1990).

*PC Card Standard*, Release 1.0, Personal Computer Memory Card International Association, pp. 1-102 (Sep. 1991).

*PC Card Standard*, Release 2.0, Personal Computer Memory Card International Association, pp. 1-1 through 6-38 (Sep. 1991).

D. A. Patterson, J. L. Hennessy, and D. Goldberg, *Computer Architecture a Quantitative Approach*, Morgan Kaufmann Publishers, Inc., p. 519 (1990).

*Primary Examiner*—Terrell W. Fears
*Attorney, Agent, or Firm*—Blakely, Sokoloff, Taylor & Zafman

[57] ABSTRACT

A nonvolatile memory card is described. The nonvolatile memory card includes a plurality of memories arranged in an array. Each of the plurality of memories includes memory cells that are electrically programmable and electrically erasable. Each of the plurality of memories requires a device power supply voltage and a reprogramming voltage. The memory card also includes the device power supply input for receiving a power supply voltage for the memory card, and voltage conversion means coupled to receive the device power supply voltage at the power supply input for providing the device power supply voltage to the plurality of memories and for generating the reprogramming voltage for erasing and programming the plurality of memories. The voltage conversion means further includes (1) a charge pump coupled to the power supply input for generating the reprogramming voltage for erasing and programming the plurality of memories, and (2) a control logic coupled to the charge pump for allowing the charge pump to generate the reprogramming voltage. The control logic causes the charge pump not to generate the reprogramming voltage when the memory card does not require a reprogramming operation in order to protect data integrity of the memory card. When the memory card requires a reprogramming operation, the control logic causes the charge pump to generate the reprogramming voltage.

11 Claims, 3 Drawing Sheets

FIG_1
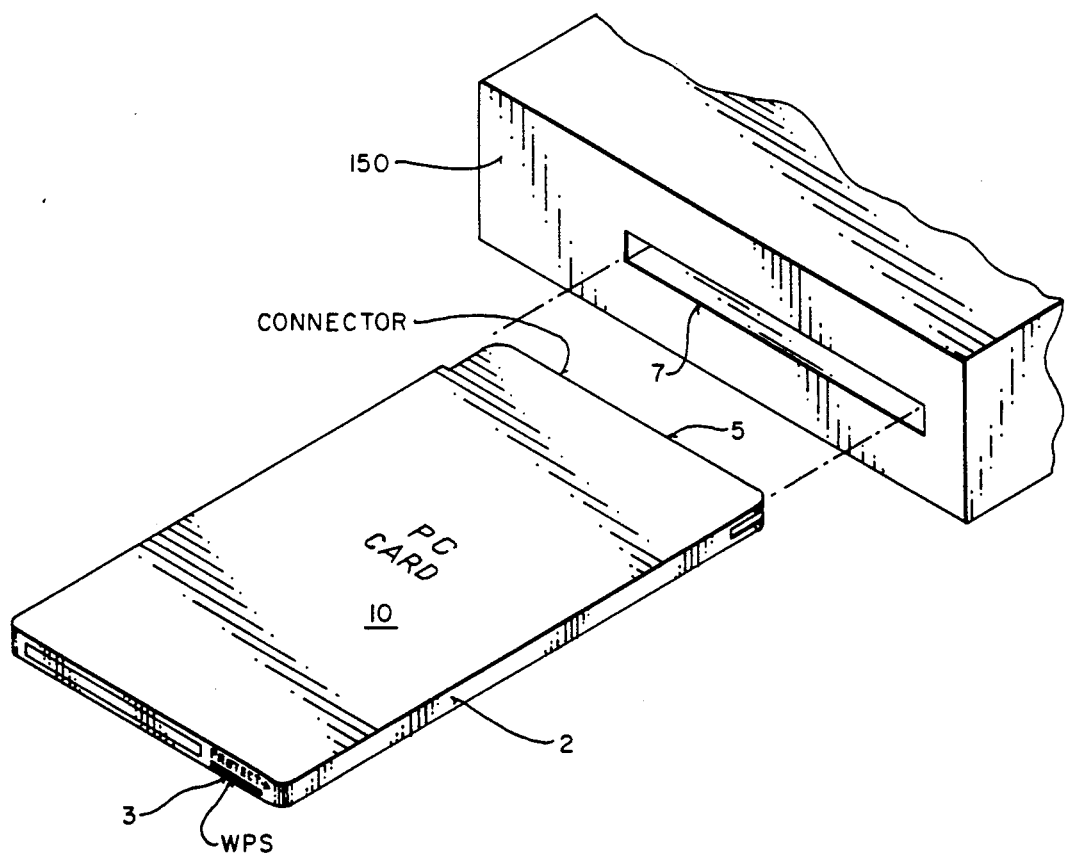

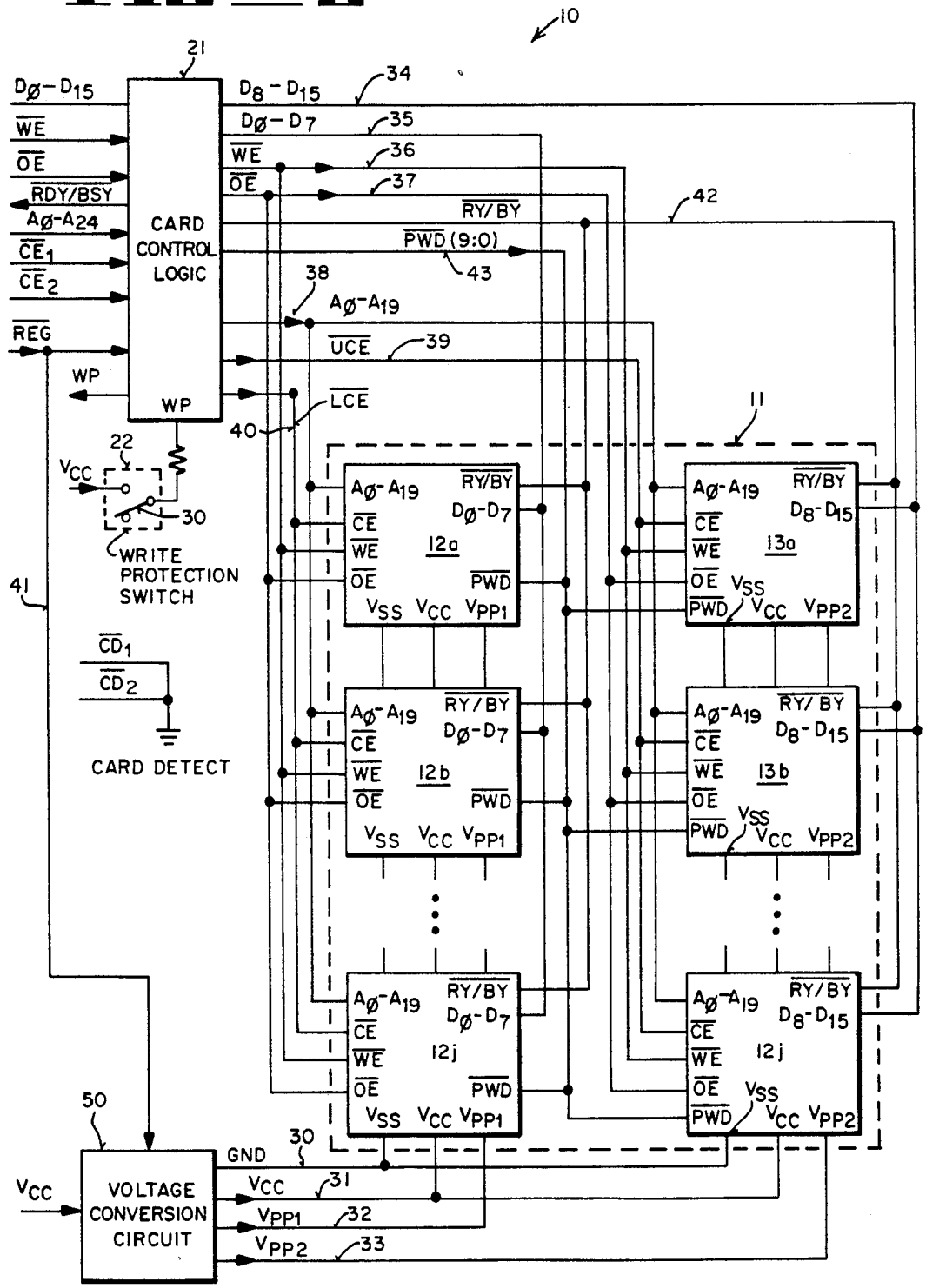

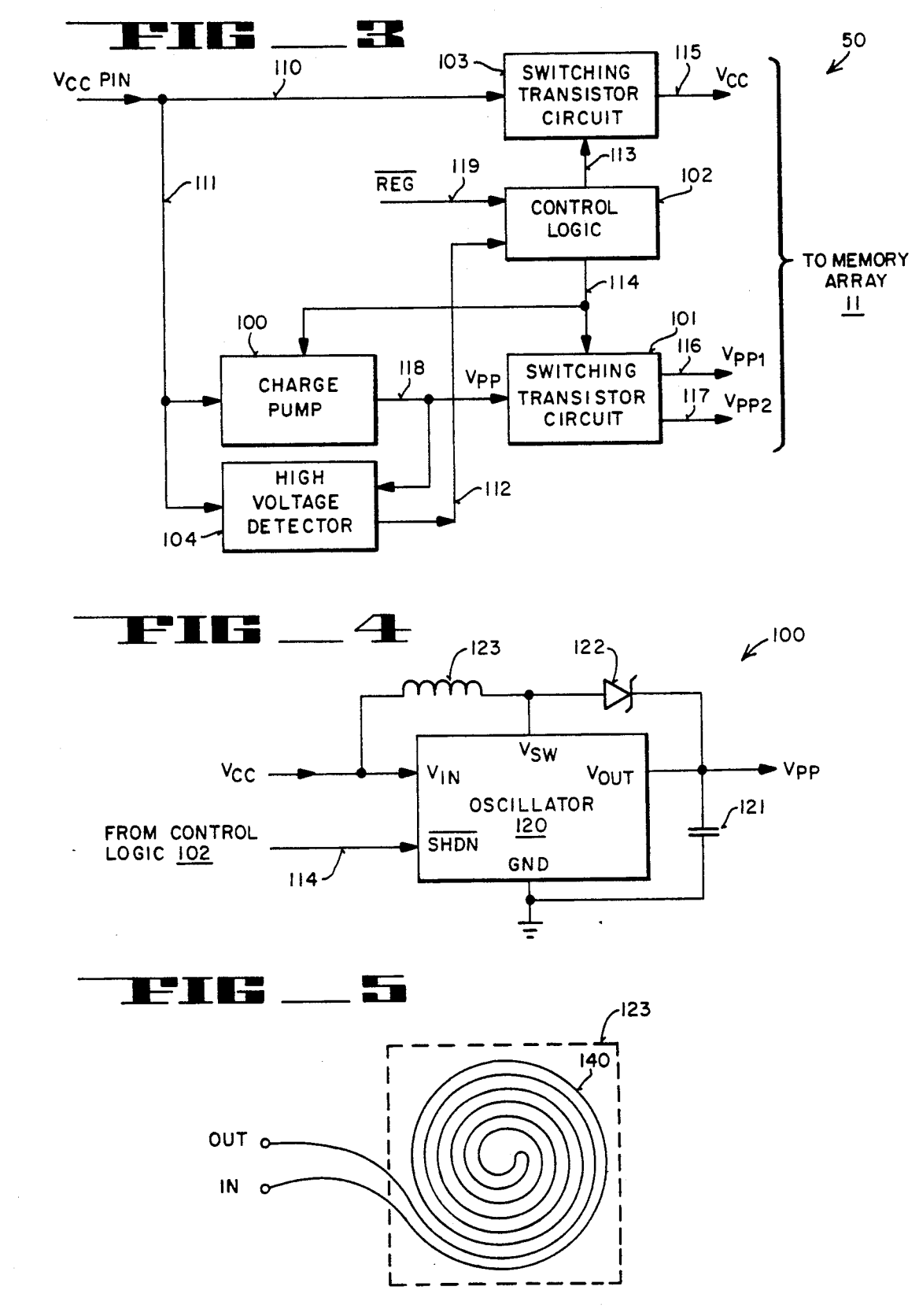

FIG_3

FIG_4

FIG_5

NONVOLATILE MEMORY CARD WITH A SINGLE POWER SUPPLY INPUT

FIELD OF THE INVENTION

The present invention pertains to the field of computer memories. More particularly, this invention relates to an erasable and programmable floating gate nonvolatile memory card with a single power supply input.

BACKGROUND OF THE INVENTION

One type of prior art metal-oxide-semiconductor ("MOS") electrically programmable read-only memory ("EPROM") uses memory cells that have electrically isolated (i.e., floating) gates. Information is stored in the memory cells in the form of electrical charge on the floating gates.

One prior EPROM is the flash erasable and electrically programmable read-only memory ("flash EPROM"). The flash EPROM can be programmed by a user, and once programmed, the flash EPROM retains its data until erased. Once programmed, the contents of the flash EPROM can be erased by electrical erasure. The flash EPROM may then be reprogrammed with new code or data.

Prior art personal computer systems typically employ removable data storage media. One common prior art removable storage medium is a floppy disk. A relatively new prior art storage medium is an integrated circuit-based memory card ("IC memory card").

Prior art flash EPROMs are nonvolatile and reprogrammable, and this has permitted the flash EPROM technology to be used for removable data storage. One such prior art application is the flash EPROM memory card ("flash memory card"). The flash memory card typically includes a number of flash EPROMs. The flash memory card can be erased and programmed electrically.

One disadvantage of this prior art flash memory card is that the card typically requires a program/erase power supply voltage $V_{PP}$ of 12 volts for programming and erasure of the flash EPROMs in the card in addition to the device power supply $V_{CC}$ of 5 volts to the card.

Prior art personal computer systems, however, typically do not provide dual power supply voltages for their external memory cards. When a flash memory card is inserted into a computer system that only includes the device power supply voltage $V_{CC}$, the flash memory card is unable to be reprogrammed and can only serve as a read-only memory card.

In addition, because small size is important, prior art laptop and notebook computers typically have minimal space for electrical circuitry, including voltage generation circuitry. Furthermore, weight is typically kept to a minimum for prior art laptop and notebook computers.

SUMMARY AND OBJECTS OF THE INVENTION

One object of the present invention is to provide a reprogrammable nonvolatile memory card with a single power supply input, wherein each nonvolatile memory on the memory card requires dual supply voltages.

Another object of the present invention is to provide circuitry for generating an erase/program supply voltage within the nonvolatile memory card.

A nonvolatile memory card is described. The nonvolatile memory card includes a plurality of memories arranged in an array. Each of the plurality memories includes memory cells that are electrically programmable and electrically erasable. Each of the plurality of memories requires a device power supply voltage and a reprogramming voltage. The memory card also includes a power supply input for receiving the device power supply voltage for the memory card, and voltage conversion means coupled to receive the device power supply voltage at the power supply input for providing the device power supply voltage to the plurality of memories and for generating the reprogramming voltage for erasing and programming the plurality of memories. The voltage conversion means further includes (1) a charge pump coupled to the power supply input for generating the reprogramming voltage for erasing and programming the plurality of memories, and (2) a control logic coupled to the charge pump for allowing the charge pump to generate the reprogramming voltage. The control logic causes the charge pump not to generate the reprogramming voltage when the memory card does not require a reprogramming operation in order to protect data integrity of the memory card. When the memory card requires a reprogramming operation, the control logic causes the charge pump to generate the reprogramming voltage.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 is a perspective view of a flash memory card;

FIG. 2 is a block diagram of the flash memory card, which includes a voltage conversion circuit;

FIG. 3 is a block diagram of the voltage conversion circuit of FIG. 2, which includes a charge pump, switching circuits, control logic, and a high voltage detector;

FIG. 4 is the circuit diagram of the charge pump;

FIG. 5 illustrates one embodiment of a small surface mount inductor for the charge pump circuit of FIG. 4.

DETAILED DESCRIPTION

FIG. 1 is a perspective view of a flash memory card 10. Inside plastic case 2 of flash memory card 10 there are a plurality of flash EPROMs (not shown in FIG. 1) for storing data at addresses. Flash memory card 10 is inserted to a slot 7 of a personal computer 150 for a memory read or write operation.

Card 10 includes connector 5 located on one side of card 10 to connect card 10 to personal computer 150 when the connector 5 is inserted into slot 7. Card 10 also includes a write protect switch ("WPS") 3.

FIG. 2 is a block diagram of flash memory card 10. Flash memory card 10 includes a memory array 11 that includes a plurality of flash EPROMs 12a through 12j and 13a through 13j, each of which includes memory cells that store data at addresses. In one embodiment, memory array 11 includes twenty flash EPROMs.

In other embodiments, memory array 11 may include more or fewer than twenty flash EPROMs. For example, memory array 11 may include two to eighteen flash EPROMs.

In one embodiment, flash memory card 10 can store 20 megabytes ("MBytes") of data.

In one embodiment, each of flash EPROMs 12a–12j and 13a–13j can stores 8 Mbits (i.e., megabits) of data. In other embodiments, each of flash EPROMs 12a–12j and 13a–13j of memory array 11 stores more or fewer than 8 Mbits of data.

Each of flash EPROMs 12a–12j and 13a–13j within memory array 11 includes address inputs $A_0$ through $A_{19}$ and data input/output pins $D_0$ through $D_7$ or $D_8$ through $D_{15}$. Addresses are latched into each of flash EPROMs 12a–12j and 13a–13j via respective address inputs $A_0$ through $A_{19}$. Each of flash EPROMs 12a–12j includes data input/output pins $D_0$ through $D_7$ and each of flash EPROMs 13a–13j includes data input/output pins $D_8$ through $D_{15}$. Data input/output pins $D_0$–$D_7$ form input/output of flash memory card 10. Data input/output pins $D_8$–$D_{15}$ form data input/output of flash memory card 10.

Each of flash EPROMs 12a–12j and 13a–13j includes a write enable input pin $\overline{WE}$, an output enable input pin $\overline{OE}$, and a chip enable input pin $\overline{CE}$. The $\overline{WE}$, $\overline{OE}$, and $\overline{CE}$ inputs are each active low. Chip enable $\overline{CE}$ is the power control for each of flash EPROMs 12a–12j and 13a–13j and is used for device selection. Output enable $\overline{OE}$ is the output control for each of flash EPROMs 12a–12j and 13a–13j and is used to gate data from data pins $D_0$–$D_7$ or $D_8$–$D_{15}$. Each of the $\overline{CE}$ and $\overline{OE}$ inputs must be logically low to obtain data at the data input/output pins of each of flash EPROMs 12a–12j and 13a–13j.

When a particular flash EPROM of flash EPROMs 11 receives a logical high signal at its $\overline{CE}$ input pin, that flash EPROM enters a standby mode. In the standby mode, power consumption by the particular flash EPROM is reduced.

A logical low $\overline{WE}$ input to a particular flash EPROM of flash EPROMs 11 allows that flash EPROM to be written to if the $\overline{CE}$ input for that flash EPROM is logically low. Addresses are latched on the falling edge of a write enable pulse. Data is latched on the rising edge of a write enable pulse. Standard microprocessor timings are used.

Each of flash EPROMs 12a–12j and 13a–13j also includes a program/erase power supply voltage input $V_{PP1}$ or $V_{PP2}$, a device power supply input $V_{CC}$, and a $V_{SS}$ input. $V_{PP1}$ is the program/erase power supply for flash EPROMs 12a–12j and $V_{PP2}$ is the program/erase power supply for flash EPROMs 13a–13j. In one embodiment, flash EPROMs 11 require $V_{PP1}$ and $V_{PP2}$ each to be approximately 12.0 volts and $V_{CC}$ to be approximately 5.0 volts. $V_{SS}$ is ground.

For another embodiment, $V_{CC}$ is approximately 3.0 volts.

Each of flash EPROMs 12a–12j and 13a–13j includes command state circuitry (not shown) and write state circuitry (not shown) for erasure and programming of the particular flash EPROM. The command state circuitry receives commands via the data input/output pins for a specific operation and controls the particular write state circuitry. The write state circuitry automates the programming and erasure within the particular flash EPROM.

In absence of a high (i.e., 12 volts) $V_{PP1}$ or $V_{PP2}$ voltage applied to a respective flash EPROM, the flash EPROM acts as a read-only memory. The data stored at an address supplied via the $A_0$–$A_{19}$ address inputs is read from its memory cell array and made available through its data input/output pins $D_0$–$D_7$ or $D_8$–$D_{15}$.

When a 12 volt $V_{PP1}$ or $V_{PP2}$ voltage is supplied to a respective flash EPROM of flash EPROMs 11, the contents of the flash EPROM can be erased by an erase operation and the device may then be reprogrammed with new data and codes via a program operation.

Each of flash EPROMs 12a–12j and 13a–13j also includes a power down pin $\overline{PWD}$. Power down pin $\overline{PWD}$ for a flash EPROM is the power down mode control. When the power down $\overline{PWD}$ signal at one of flash EPROMs 12a–12j and 13a–13j is at logical low level, that flash EPROM enters the power down mode.

Each of flash EPROMs 12a–12j and 13a–13j also includes a ready/busy output pin $\overline{RY/BY}$. Ready/busy $\overline{RY/BY}$ is the ready/busy indicator of each of flash EPROMs 12a–12j and 13a–13j. The $\overline{RY/BY}$ output of each of flash EPROMs 12a–12j and 13a–13j is active low. A logically high $\overline{RY/BY}$ output of a flash EPROM indicates a "ready" condition or mode for the flash EPROM (i.e., ready to accept an operation). A logically low $\overline{RY/BY}$ output indicates a "busy" condition or mode for the flash EPROM (i.e., the write state circuitry is presently busy).

Flash memory card 10 further includes card control logic 21. Card control logic 21 interfaces between card pins of flash memory card 10 and memory array 11. Card control logic 21 includes address decoder (not show), data control circuit (not shown), and card control registers (not shown).

Flash memory card 10 includes address input pins $A_0$ through $A_{24}$ and data input/output pins $D_0$ through $D_{15}$. Both address pins $A_0$–$A_{24}$ and data pins $D_0$–$D_{15}$ are coupled to card control logic 21. Address pins $A_0$–$A_{24}$ are used to receive addresses for memory locations. Addresses applied to pins $A_0$–$A_{24}$ are latched. Data pins $D_0$–$D_{15}$ are employed to input data during memory write cycles, and to output data during memory read cycles. Data pins $D_0$–$D_{15}$ are active high and float to tri-state OFF when card 10 is deselected or the outputs are disabled. Data is internally latched to flash EPROMs 12a–12j and 13a–13j via $D_0$–$D_7$ data bus 35 and $D_8$–$D_{15}$ data bus 34 during a write cycle. $D_0$–$D_7$ data bus 35 is coupled to flash EPROMs 12a–12j. $D_8$–$D_{15}$ data bus 34 is coupled to flash EPROMs 13a–13j.

Flash memory card 10 receives card enable inputs $\overline{CE_1}$ and $\overline{CE_2}$ and output enable input $\overline{OE}$. Card enables $\overline{CE_1}$ and $\overline{CE_2}$ are power controls that are used for selecting flash EPROMs 12a–12j and 13a–13j. Output enable $\overline{OE}$ is the output control of the card and is used to gate data from $D_0$–$D_{15}$ pins independent of accessed flash EPROM selection. The $\overline{OE}$ signal is coupled to the $\overline{OE}$ pin of each of flash EPROM 12a–12j and 13a–13j via line 37. When the $\overline{OE}$ is at logical high level, the outputs from all flash EPROMs 12a–12j and 13a–13j are disabled. Data input/output pins $D_0$–$D_{15}$ of the card are placed in a high impedance state.

Card enable $\overline{CE_1}$ is used to enable flash EPROMs 12a–12j. Card enable $\overline{CE_2}$ is used to enable flash EPROMs 13a–13j. When both $\overline{CE_1}$ and $\overline{CE_2}$ are at a logical high level, the card is deselected and the power consumption is reduced to standby level. When one of the $\overline{CE_1}$ and $\overline{CE_2}$ signals is at logical high level, the corresponding ones of flash EPROMs 12a–12j and 13a–13j are in standby mode and the standby operation disables one-half of the data output of card control logic 21. The outputs of deselected flash EPROMs are placed in a high impedance state independent of their respective output enable signals $\overline{OE}$.

Flash memory card 10 also includes a card write enable pin $\overline{WE}$. The card write enable $\overline{WE}$ controls writes to card control logic 21 and flash EPROMs 12a–12j and 13a–13j. The $\overline{WE}$ signal is active low. When the card $\overline{WE}$ is at logical high level, data input to flash memory card 10 is disabled. The $\overline{WE}$ signal is coupled to the $\overline{WE}$ input of each of flash EPROMs 12a–12j and 13a–13j via line 36.

The address decoder of card control logic 21 provides the necessary logic to decode the individual chip enable $\overline{CE}$ signals needed internally to card 10 to select among flash EPROMs 12a–12j and 13a–13j. Chip enable signal $\overline{CE}$ for flash EPROMs 12a–12j is provided via a $\overline{LCE}$ signal line 40. Chip enable signal $\overline{CE}$ for flash EPROMs 13a–13j is supplied via a $\overline{UCE}$ signal line 39. Memory address decoding is linearly mapped in card 10. The memory address is then applied to the selected one of flash EPROMs 12a–12j and 13a–13j via $A_0$–$A_{19}$ address bus 38.

Flash memory card 10 also includes a card ready/busy output pin $\overline{RDY/BSY}$. The card ready/busy $\overline{RDY/BSY}$ output indicates whether the card is busy or ready. Card control logic 21 receives the $\overline{RY/BY}$ output from each of flash EPROMs 12a–12j and 13a–13j via line 42 and then outputs the card ready/busy output $\overline{RDY/BSY}$ to external circuitry.

Flash memory card 10 includes an active low register memory select input pin $\overline{REG}$. The $\overline{REG}$ signal, when logically low, allows card control logic 21 to output PCMCIA/JEIDA (Personal Computer Memory Card International Association/Japan Electronic Industry Development Association) card information structure data to external circuitry. This ability of card control logic 21 is accomplished by initially formatting the card with this data. In addition, when the $\overline{REG}$ signal is logically low, the PCMCIA/JEIDA card information structure data stored in card control logic 21 can be updated by a write operation to card control logic 21. In other words, the $\overline{REG}$ pin controls the operation to either flash EPROMs 12a–12j and 13a–13j or card control logic 21.

In one embodiment, when the $\overline{REG}$ pin is at low level, the operation is directed to card control logic 21. When the $\overline{REG}$ pin is at high level, the operation is directed to flash EPROMs 12a–12j and 13a–13j. In an alternative embodiment, when the $\overline{REG}$ signal is high, the operation is directed to card control logic 21 and the low $\overline{REG}$ signal selects flash EPROMs 12a–12j and 13a–13j for the operation.

Flash memory card 10 includes two card detection pins $\overline{CD_1}$ and $\overline{CD_2}$. The card detection pins $\overline{CD_1}$ and $\overline{CD_2}$ allow host computer system (not shown) to determine if card 10 is properly loaded. The card detection pins $\overline{CD_1}$ and $\overline{CD_2}$ are both active low, internally tied to ground. Each of the $\overline{CD_1}$ and $\overline{CD_2}$ is read through a port bit. If only one of two bits shows card 10 to be present, the host computer system will instruct the user to reinsert card 10 squarely into its respective socket. Card detection $\overline{CD_1}$ and $\overline{CD_2}$ can also tell the system whether or not to redirect drives in the case of system booting.

Flash memory card 10 includes a write protection switch 22. Switch 22 disables circuitry (not shown) in card control logic 21 that controls the write enable signal $\overline{WE}$ to flash EPROMs 12a–12j and 13a–13j. When switch 22 is activated (i.e., a switch knife 30 is connected to the $V_{CC}$), the $\overline{WE}$ output of card control logic 21 is forced high, thus preventing any writes to each of flash EPROMs 12a–12j and 13a–13j. Switch 22 provides one type of write protection to flash memory card 10.

Each flash EPROM flash EPROMs 12a–12j and 13a–13j contains 16 separate individually erasable 64 kilobyte blocks.

Flash memory card 10 also includes a write protection output pin WP that indicates the state of write protection switch 22.

Flash memory card 10 can be read, erased, and programmed in a byte wide or word wide mode.

For the word wide addressing mode, each data word is sixteen bits wide. For the word wide addressing mode, a pair of flash EPROMs is used. One flash EPROM of the pair is from flash EPROMs 12a–12j. The other flash EPROM of the pair is a corresponding flash EPROM from flash EPROMs 13a–13j. For word wide addressing, the blocks of flash EPROMs 12a–12j contain high bytes. For word wide addressing, the blocks of flash EPROMs 13a–13j contain low bytes.

For the word wide addressing mode, there is an increment of two (hexadecimal) between each address. As a result, the value of address bit $A_0$ (the least significant address bit) is irrelevant in the word wide addressing mode.

For the byte wide addressing mode, each data word is eight bits wide. For the byte wide addressing mode, the word resides in one of flash EPROMs 12a–12j or in one of flash EPROMs 13a–13j. For byte wide addressing, the blocks of flash EPROMs 12a–12j contain odd bytes. For byte wide addressing, the blocks of flash EPROMs 13a–13j contain even bytes.

For the byte wide addressing mode, a binary one value for address bit $A_0$ means an odd byte, and a binary zero value for bit $A_0$ means an even byte.

In the byte wide mode, only one of the card enable signals $\overline{CE_1}$ and $\overline{CE_2}$ is logically low. In the word wide mode, both card enable signals $\overline{CE_1}$ and $\overline{CE_2}$ are logically low. $\overline{CE_1}$ and $V_{PP1}$ control EPROMs 12a–12j. $\overline{CE_2}$ and $V_{PP2}$ control flash EPROMs 13a–13j.

Card control logic 21 makes data access mode decisions with respect to flash EPROMs 12a–12j and 13a–13j based on the states of register select input $\overline{REG}$, card enable signals $\overline{CE_1}$ and $\overline{CE_2}$, address bit $A_0$, output enable bit $\overline{OE}$, write enable signal $\overline{WE}$, program/erase power supply voltages $V_{PP1}$ and $V_{PP2}$, and write protect switch 22.

$V_{CC}$ is the device power supply for flash memory card 10 and GND is ground for the card. In one embodiment, $V_{CC}$ is approximately 5.0 volts.

The device power supply $V_{CC}$ is coupled to a voltage conversion circuit 50. Voltage conversion circuit 50 also receives the $\overline{REG}$ signal via line 41. Voltage conversion circuit 50 applies the $V_{CC}$ voltage to each of flash EPROMs 12a–12j and 13a–13j. Voltage conversion circuit 50 generates and applies the program/erase voltage $V_{PP}$ to each of flash EPROMs 12a–12j and 13a–13j.

Flash memory card 10 has a power down mode. When flash memory card 10 enters the power down mode, all circuits of card 10 are powered off (except voltage conversion circuit 50). The power consumption of the card in the power down mode is substantially less than that of the card in standby mode.

Card control logic 21 is coupled to the $\overline{PWD}$ pin of each of flash EPROMs 12a–12j and 13a–13j via lines 43.

Lines 43 include ten signal lines [9:0], each being coupled to one of flash EPROMs 12a–12j and one of flash EPROMs 13a–13j. For example, one of lines 43 is coupled to flash EPROMs 12a and 13a. Therefore, flash EPROMs 12a and 13a form a pair for that $\overline{PWD}$ line. Each of lines 43 couples the power down information for each pair of flash EPROMs 12a–12j and 13a–13j. As described above, card control logic 21 includes card control registers. Card control registers also store power down information of each of flash EPROMs 12a–12j and 13a–13j. The information stored in the card control registers is then coupled to the $\overline{PWD}$ pin of each of flash EPROMs 12a–12j and 13a–13j via lines 43 to control the power down mode of each pair of flash EPROMs 12a–12j and 13a–13j. The contents of the card control registers are set using address pins $A_0$–$A_{24}$, data pins $D_0$–$D_{15}$, and the register memory select input pin $\overline{REG}$. The $\overline{REG}$ signal controls the update of the contents stored in the registers. When $\overline{REG}$ signal is logical low, the contents in the registers can be updated. When the $\overline{REG}$ signal is logical high, the contents in the registers remain unchanged.

As described above, the $\overline{REG}$ signal is also coupled to voltage conversion circuit 50. Voltage conversion circuit 50 includes a latch (not shown) that stores the power down mode information of flash memory card 10. The $\overline{REG}$ signal, when at high, allows the content of the latch in voltage conversion circuit 50 to switch off the power supply for the card if the content indicates a deep power down mode, thus causing flash memory card 10 to enter the deep power down mode. Voltage conversion circuit 50 is switched off and no $V_{CC}$ and $V_{PP}$ voltages are coupled to the $V_{CC}$, $V_{PP1}$ and $V_{PP2}$ pins of flash EPROMs 12a–12j and 13a–13j via $V_{CC}$, $V_{PP1}$ and $V_{PP2}$ lines 31–33, respectively. When the content of the latch does not indicate a power down mode for the card, the high $\overline{REG}$ signal will not cause voltage conversion circuit 50 to switch off the power supply for the card and flash memory card 10 remains normally powered on.

The $\overline{REG}$ signal, when logically low, allows the update of the information stored in the latch of voltage conversion circuit 50. When flash memory card 10 enters a write mode as the result of a low $\overline{WE}$ signal and a low $\overline{CE_1}$ signal or by a low $\overline{WE}$ signal and low $\overline{CE_1}$ and $\overline{CE_2}$ signals while the $\overline{REG}$ signal is low, the content of the latch is updated.

When the $\overline{REG}$ signal goes to logical high level, the content of the latch is blocked from being updated by any write operation.

The circuitry of voltage conversion circuit 50 and its functions are described below, in conjunction with FIGS. 3 and 4.

FIG. 3 illustrates in block diagram the voltage conversion circuit 50 of FIG. 2. In FIG. 3, the $V_{CC}$ pin of flash memory card 10 receives the device power supply voltage $V_{CC}$. As described above, the $V_{CC}$ pin can receive voltages other than the device power supply voltage $V_{CC}$.

The $V_{CC}$ voltage received is then applied to switching transistor circuit 103 via line 110. The switching transistor circuit 103 includes a FET transistor. In one embodiment, switching transistor circuit 103 includes an N-channel FET transistor. In another embodiment, circuit 103 includes a P-channel FET transistor. The FET transistor has its gate coupled to a control logic 102 via line 113. Control logic 102 comprises the above mentioned latch. As described above, the content of the latch controls flash memory card 10 to enter the power down mode. The content in the latch can also be updated by the low $\overline{REG}$ signal.

The output of switching transistor circuit 103 supplies the $V_{CC}$ voltage to the $V_{CC}$ pin of each of flash EPROMs 12a–12j and 13a–13j via $V_{CC}$ line 31 (FIG. 2). Switching transistor circuit 103 is controlled by control logic 102 via line 113. When flash memory card 10 enters the power down mode x under the power down mode information stored in the latch, switching transistor circuit 103 is switched off by the power down information from control logic 102 via line 113. When switching transistor circuit 103 is switched off, the device power supply voltage $V_{CC}$ at the $V_{CC}$ pin of card 10 does not pass onto the $V_{CC}$ pin of each of flash EPROMs 12a–12j and 13a–13j.

Voltage conversion circuit 50 also includes a charge pump 100. Charge pump 100 is coupled to receive the device power supply voltage $V_{CC}$ at the $V_{CC}$ pin. The function of charge pump 100 is to convert the $V_{CC}$ voltage into a program/erase voltage $V_{PP}$, which is higher. In this case, the program/erase voltage $V_{PP}$ is generated internally in card 10. The internally generated $V_{PP}$ voltage, therefore, eliminates the need for single power supply flash EPROMs to be installed in flash memory card 10. Moreover, the ability of internally generating the $V_{PP}$ voltage by charge pump 100 in flash memory card 10 allows the card to undergo erase and programming operations in a single power supply computer system.

In one embodiment, the program/erase voltage $V_{PP}$ is approximately 12.0 volts, and the power supply voltage $V_{CC}$ is approximately 5.0 volts. For another embodiment, the $V_{CC}$ voltage is approximately 3.0 volts.

For an alternative embodiment, flash memory card 10 of FIG. 2 receives the reprogramming voltage $V_{PP}$ and voltage conversion circuit 50 converts the reprogramming voltage $V_{PP}$ into the device power supply voltage $V_{CC}$. In this case, the $V_{CC}$ pin of FIG. 3 will be the $V_{PP}$ pin and the $V_{PP}$ pin is coupled to switching transistor circuit 103 while the $V_{CC}$ voltage from charge pump 100 is coupled to circuit 101. For this case, flash memory card 10 of FIG. 2 remains single powered.

In a further embodiment, flash memory card 10 of FIG. 2 receives a voltage which is neither the power supply voltage, nor the program/erase voltage. In this case, voltage conversion circuit 50 generates the device power supply voltage $V_{CC}$ and the program/erase voltage $V_{PP}$ from the voltage received. The voltage received can be at any voltage level. For example, the voltage can be approximately 3 volts or 15 volts.

For one embodiment, charge pump 100 is a capacitive voltage charge pump. For another embodiment, charge pump 100 is an inductive voltage charge pump. FIG. 4 shows a circuitry diagram of one specific embodiment of charge pump 100.

Charge pump 100 is then coupled to a switching transistor circuit 101 via line 118 for providing the program/erase voltage $V_{PP}$ to flash EPROMs 12a–12j and 13a–13j. Switching transistor circuit 101 supplies the program/erase voltage $V_{PP}$ at its $V_{PP1}$ and $V_{PP2}$ outputs to flash EPROMs 12a–12j and 13a–13j via $V_{PP1}$ and $V_{PP2}$ lines 32 and 33, respectively. As can be seen from FIG. 3, control logic 102 also controls switching transistor circuit 101 and charge pump 100 via line 114. When the power down information stored in control logic 102 switches off switching transistor circuit 101 and charge pump 100, the $V_{PP1}$ and $V_{PP2}$ outputs of circuit 101 do not receive high program/erase voltage $V_{PP}$ from charge pump 100.

Voltage conversion circuit 50 further includes a high voltage detector 104. High voltage detector 104 detects the high $V_{PP}$ voltage at the $V_{PP}$ output of charge pump 100. The output of high voltage detector 104 is connected to control logic 102. When high voltage detector 104 detects a valid high $V_{PP}$ voltage, control logic 102 receives a corresponding signal via line 112 from high voltage detector 104.

As can be seen from FIG. 3, the $\overline{REG}$ signal is applied to control logic 102 via line 119. When the $\overline{REG}$ signal is high, the content of the latch in control logic 102 is accessed. When the content stored in the latch indicates the power down mode for flash memory card 10, switching transistor circuits 101 and 103 switch off and block the device power supply voltage $V_{CC}$ and the program/erase voltage $V_{PP}$ at charge pump 100 from passing onto the $V_{CC}$, $V_{PP1}$, and $V_{PP2}$ outputs, respectively. Meanwhile, control logic 102 switches off charge pump 100 via line 114. Thus the $V_{CC}$, $V_{PP1}$ and $V_{PP2}$ pins of flash EPROMs 12a-12j and 13a-13j receive no $V_{CC}$ and $V_{PP}$ power supplies. In this case, flash memory card 10 enters the power down mode.

When the content of the latch of control logic 102 does not indicate the power down mode for flash memory card 10, control logic 102 does not switch off charge pump 100 and does not switch off switching transistor circuits 101 and 103 when the high $\overline{REG}$ signal is received.

Meanwhile, switching transistor circuit 101 is also controlled by high voltage detector 104 to be on or off. If high voltage detector 104 detects that charge pump 100 outputs a valid $V_{PP}$ voltage, then control logic 102 switches on switching transistor circuit 101 to couple the $V_{PP}$ voltage onto the flash EPROMs 12a-12j and 13a-13j. Otherwise, switching transistor circuit 101 remains turned off and no $V_{PP}$ voltage passes through. In this case, unintentional writes to flash EPROMs 12a-12j and 13a-13j are prevented and data integrity of flash memory card 10 is preserved. This provides another type of write protection to flash memory card 10.

For an alternative embodiment, control logic 102 applies its content directly to the power down pin $\overline{PWD}$ of each of flash EPROMs 12a-12j and 13a-13j. When the content of control logic 102 is a logical low signal (i.e., a power down signal), it causes each of flash EPROMs 12a-12j and 13a-13j to enter the power down mode. Flash memory card 10 also enters the power down mode.

FIG. 4 is a circuit diagram of one embodiment of charge pump 100 of FIG. 3. In FIG. 4, charge pump 100 includes an integrated DC-DC converter 120 having an oscillator in it, an inductor 123, a diode 122, and a capacitor 121. Converter 120 includes a $V_{IN}$ pin which receives the $V_{CC}$ voltage, a $V_{OUT}$ output pin which outputs the program/erase voltage $V_{PP}$, a $V_{SW}$ pin, and a GND pin which is coupled to ground. Converter 120 further includes a control shut down $\overline{SHDN}$ pin. The $\overline{SHDN}$ pin is used to control the switch off of converter 120 when a logic low shut down signal is received at the $\overline{SHDN}$ pin.

For one embodiment, the frequency of the oscillator in converter 120 is 130 KHz. For alternative embodiments, the frequency of the oscillator may be faster or slower than 130 KHz. For one embodiment, converter 120 is a LT1109-12 DC-DC converter manufactured by Linear Technology Corp. of Milpitas, Calif.

The $V_{PP}$ voltage is obtained at the $V_{OUT}$ pin of converter 120 when the control signal at the $\overline{SHDN}$ pin is at logical high level. When the control signal at the $\overline{SHDN}$ pin is logical low, converter 120 is turned off and no $V_{PP}$ voltage is obtained at the $V_{OUT}$ pin.

The gated-oscillator design of charge pump 100 as shown in FIG. 4 requires no frequency compensation components. The 130 KHz high frequency oscillator in converter 120 permits the use of relatively small surface mount inductors and capacitors.

FIG. 5 illustrates one way of implementing small surface mount inductor 123 of charge pump 100 of FIG. 4 on the printed circuit board of flash memory card 10 of FIG. 1. In FIG. 5, inductor 123 is a swirled metal trace 140 on the printed circuit board of flash memory card 10 (FIG. 1). Swirled metal trace 140 has one end as input terminal and the other as output terminal. Swirled metal trace 140 is then sandwiched by ferrite material (not shown) on top and bottom surfaces of the printed circuit board to form inductor 123. In this way, the thickness of inductor 123 is kept relatively small.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory card, comprising:
   (A) a plurality of memories arranged in an array, wherein each of the plurality memories includes memory cells that are electrically programmable and electrically erasable, wherein each of the plurality of memories requires a device power supply voltage and a reprogramming voltage;
   (B) a power supply input for receiving the device power supply voltage for the memory card; and
   (C) voltage conversion means coupled to receive the device power supply voltage at the power supply input for providing the device power supply voltage to the plurality of memories and for generating the reprogramming voltage for erasing and programming the plurality of memories, wherein the voltage conversion means further comprises:
   (i) a charge pump coupled to the power supply input for generating the reprogramming voltage for erasing and programming the plurality of memories; and
   (ii) a control logic coupled to the charge pump for allowing the charge pump to generate the reprogramming voltage, wherein the control logic causes the charge pump not to generate the reprogramming voltage when the memory card does not require a reprogramming operation in order to protect data integrity of the memory card, wherein when the memory card requires a reprogramming operation, the control logic causes the charge pump to generate the reprogramming voltage.

2. The memory card of claim 1, wherein the reprogramming voltage is approximately 12 volts, the power supply voltage is approximately 5 volts.

3. The memory card of claim 1, wherein the charge pump is a capacitive voltage charge pump.

4. The memory card of claim 1, wherein the charge pump is an inductive voltage charge pump circuit.

5. The memory card of claim 1, wherein the charge pump further comprises a first switching transistor for coupling the reprogramming voltage to the plurality of memories of the memory card, wherein the first switching transistor has a gate coupled to the control logic, wherein the control logic controls on and off of the first switching transistor.

6. The memory card of claim 5, wherein the voltage conversion circuit further comprises a high voltage detector for detecting voltage level of the output of the voltage charge pump, wherein the high voltage detector is also coupled to the control logic, wherein when the voltage charge pump does not provide the reprogramming voltage, the high voltage detector informs the control logic to switch off the first switching transistor.

7. The memory card of claim 6, wherein the voltage conversion means further comprises a second switching transistor for coupling the power supply voltage at the power supply input to each of the memories, wherein the second switching transistor has a gate coupled to the control logic, wherein the control logic controls on and off of the second switching transistor.

8. The memory card of claim 7, wherein the high voltage detector is also coupled to the power supply input, wherein the high voltage detector detects if the power supply input receives the reprogramming voltage, and if so, informs the control logic to switch off the second switching transistor.

9. The memory card of claim 1, wherein the reprogramming voltage is approximately 12 volts, the power supply voltage is approximately 3 volts.

10. The memory card of claim 4, wherein the inductive voltage charge pump includes a surface mount inductor on the voltage charge pump circuit.

11. The memory card of claim 10, wherein the inductor is a swirled trace sandwiched by ferrite material in order to avoid occupying large space on the voltage charge pump circuit.

* * * * *